United States Patent
Sahbari

(10) Patent No.: US 6,660,460 B2
(45) Date of Patent: Dec. 9, 2003

(54) STRIPPER

(75) Inventor: Javad J. Sahbari, Sunnyvale, CA (US)

(73) Assignee: Shipley Company, L.L.C., Marlborough, MA (US)

(*) Notice: Subject to any disclaimer, the term of this patent is extended or adjusted under 35 U.S.C. 154(b) by 0 days.

(21) Appl. No.: 10/251,293

(22) Filed: Sep. 20, 2002

(65) Prior Publication Data

US 2003/0030030 A1 Feb. 13, 2003

Related U.S. Application Data

(62) Division of application No. 09/628,975, filed on Jul. 31, 2000, now Pat. No. 6,475,292.

(51) Int. Cl.⁷ .......................... G03F 7/42; C11D 17/00; C11D 17/08
(52) U.S. Cl. ..................... 430/331; 430/329; 510/175; 510/176; 510/267; 510/274; 510/414
(58) Field of Search ................. 430/329, 331; 510/175, 176, 267, 274, 414

(56) References Cited

U.S. PATENT DOCUMENTS

| | | | |
|---|---|---|---|
| 3,871,929 A | 3/1975 | Schevey | 134/3 |
| 4,165,294 A | 8/1979 | Vander Mey | 134/38 |
| 4,165,295 A | 8/1979 | Vander Mey | 134/38 |
| 4,215,005 A | 7/1980 | Vander Mey | 134/38 |
| 4,221,674 A | 9/1980 | Vander Mey | 134/38 |
| 4,304,681 A | 12/1981 | Martin et al. | 430/315 |
| 4,395,348 A | 7/1983 | Lee | 134/38 |
| 4,426,311 A | 1/1984 | Vander Mey | 134/38 |
| 4,992,108 A | 2/1991 | Ward et al. | 134/38 |
| 5,080,831 A * | 1/1992 | VanEenam | 252/558 |
| 5,468,422 A * | 11/1995 | Khouzam et al. | 134/38 |
| 6,261,735 B1 | 7/2001 | Sahbari | 134/42 |

FOREIGN PATENT DOCUMENTS

WO    WO 00/33140    6/2000

* cited by examiner

*Primary Examiner*—Richard L. Schilling
(74) *Attorney, Agent, or Firm*—S. Matthew Cairns

(57) ABSTRACT

Compositions suitable for removing photoresist, probing ink and wafer bonding adhesive from a substrate containing one or more ($C_6$–$C_{16}$)olefins, one or more ($C_1$–$C_6$) alkoxybenzenes, and one or more organic sulfonic acid compounds are provided. Such compositions show reduced metal corrosion, low toxicity and rapid removal rates of both photoresists and probing inks.

19 Claims, No Drawings

STRIPPER

This application is a divisional of application Ser. No. 09/628,975, filed on Jul. 31, 2000, now U.S. Pat. No. 6,475,292.

BACKGROUND OF THE INVENTION

This invention relates generally to the field of photoresist removers. In particular, the present invention relates to compositions useful for the removal of photoresists and probing inks from an electronic device substrate.

In the manufacture of semiconductor microcircuits it is necessary to mark defective microchips during the final electrical testing with an epoxy or polyurethane based ink on the finished silicon wafer to distinguish bad dies from the good dies. After the electrical test is done, sometimes it may be deemed necessary to clean the ink off the silicon wafer because of a wrong electrical test program, because bonding pads were misprobed, or for other rework reasons. This allows the silicon wafer to be retested or reprobed with the necessary corrections. Conventional solvents such as alcohols, ketones and esters, or more aggressive heterocyclic or commonly used aprotic polar solvents such as N-methyl pyrrolidone, dimethyl acetamide or dimethyl sulfoxide do not remove hard baked and cured epoxy type probing ink even at elevated temperatures and long process times.

Highly acidic or alkaline solutions and strong oxidizing agents on the other hand, such as fuming nitric acid, sulfuric acid/hydrogen peroxide, and tetramethyl ammonium hydroxide or other alkaline solutions may be effective in removing the ink, but they create corrosion difficulties and stain or destroy the sensitive alloys, such as Al/Cu/Si, in bonding pad areas of the wafer.

Negative-type photoresists are used for lithographically delineating patterns onto a substrate so that the patterns can be subsequently etched or otherwise defined into the substrate material. The resist material is deposited as a film and the desired pattern is defined by exposing the resist film to energetic radiation. Thereafter the unexposed regions are subject to a dissolution by a suitable developer liquid. After the pattern has been thus defined in the substrate the resist material must be completely removed from the substrate to avoid adversely affecting or hindering subsequent operations or processing steps.

It is necessary in such a photolithographic process that the photoresist material, following pattern delineation, be evenly and completely removed from all exposed areas so as to permit further lithographic operations. Even the partial remains of a resist in an area to be further patterned is undesirable. Also, undesired resist residues between patterned lines can have deleterious effects on subsequent processes, such as metallization, or cause undesirable surface states and charges.

For example, U.S. Pat. No. 4,992,108 (Ward et al.) discloses a negative photoresist stripping composition consisting essentially of about 60 to 96% wt of diiopropylbenzene and about 4 to 40% wt of an organic sulfonic acid. U.S. Pat. No. 4,165,294 (Mey) discloses a photoresist stripping composition including about 5 to 60% wt of a surfactant alkylarylsulfonic acid having 12–20 carbons; about 15 to 95% wt of a hydrotropic aromatic sulfonic acid having 6–9 carbons; and from about 0 to 40% wt of a halogen-free aromatic hydrocarbon solvent with a boiling point above 150° C. Such compositions disclosed in these patents show some corrosion of sensitive metal parts.

PCT patent application WO 00/33140 (Sahbari) discloses a composition for removing probing ink or photoresist including from about 25 to about 85% wt anisole and from about 15 to about 60% wt of an alkylarylsulfonic acid having 12 to 20 carbons. While such compositions do not show corrosion of sensitive metal parts, such compositions suffer from volatility of the components and shortened bath life.

It is therefore highly desirable to provide an environmentally safe stripping composition that in a reasonably short process time cleans only the cured probing ink or photoresist without leaving any residue, and that is also safe to use on sensitive metal layers. It is further desirable to provide a stripping composition having decreased volatility and increased bath life.

SUMMARY OF THE INVENTION

It has been surprisingly found that the compositions of the present invention are effective at removing photoresists and probing inks from electronic device substrates, such as silicon wafers, without causing corrosion of the substrates. Such compositions are also lower in toxicity and are more non-hazardous to the user and the environment than known compositions. The compositions of the present invention also remove such photoresists and probing inks more quickly than conventional strippers. It has also been surprisingly found that such compositions are effective as debonding agents for removing wafer bonding adhesives.

In one aspect, the present invention provides a composition including one or more ($C_6$–$C_{16}$)olefins, one or more ($C_1$–$C_6$)alkoxybenzenes, and one or more organic sulfonic acid compounds.

In a second aspect, the present invention provides a method for removing material selected from photoresist, probing ink or wafer bonding adhesive from a substrate including the step of contacting the material with the composition described above.

In a third aspect, the present invention provides a method for manufacturing electronic devices including the steps of disposing a photoresist on a substrate to form a photoresist layer, exposing the photoresist layer through a photomask to a source of activating radiation, developing the photoresist layer to produce a pattern, etching-the photoresist to transfer the pattern to the substrate, and removing the photoresist layer, wherein the photoresist layer is removed by contacting the photoresist with the composition described above.

DETAILED DESCRIPTION OF THE INVENTION

An object of this invention is to provide compositions for probing ink, photoresist and wafer bonding adhesive removal. Such compositions are not corrosive to sensitive alloys and do not adversely effect the sensitive bonding pad areas of a semiconductor wafer.

As used throughout this specification, the following abbreviations shall have the following meanings unless the context clearly indicates otherwise: PVA=poly(vinyl acetate); % wt=percent by weight; mL=milliliter; ° C.=degrees Centigrade; min.=minutes; and sec.=seconds. All percents are by weight. All numerical ranges are inclusive.

The terms "stripping" and "removing" are used interchangeably throughout this specification. Likewise, the terms "stripper" and "remover" are used interchangeably. "Alkyl" and "alkoxy" refer to linear, branched and cyclic alkyl and alkoxy, respectively.

The compositions of the present invention include one or more ($C_6$–$C_{16}$)Olefins, one or more ($C_1$–$C_6$)

alkoxybenzenes, and one or more organic sulfonic acid compounds. The ($C_6$–$C_{16}$)olefins useful in the present invention may have at least one one olefinic bond. By "olefinic bond" is meant a carbon—carbon double bond. Suitable ($C_6$–$C_{16}$)olefins include, but are not limited to, ($C_6$–$C_{16}$)olefins having one carbon—carbon double bond, ($C_6$–$C_{16}$)dienes, ($C_6$–$C_{16}$)trienes, and the like. Particularly suitable ($C_6$–$C_{16}$)olefins include alpha-olefins. "Alpha-olefins" are olefins having a carbon—carbon double bond between the first and second carbon of the carbon chain, but may have additional olefinic bonds in the carbon chain. Preferred alpha-olefins include ($C_8$–$C_{16}$)olefins, and more preferably 1-decene and 1-dodecene. Mixtures of olefins are particularly suitable for use in the present invention and mixtures of alpha-olefins are preferred. Such olefins are generally commercially available from a variety of sources and may be used without further purification. The amount of ($C_6$–$C_{16}$)olefins present in the compositions of the invention is typically in the range of from about 10 to about 55% wt, based on the total weight of the composition, and preferably from about 20 to about 40% wt.

Any ($C_1$–$C_6$)alkoxybenzene may be used in the present invention. Such ($C_1$–$C_6$)alkoxybenzenes may be substituted. By "substituted ($C_1$–$C_6$)alkoxybenzenes" is meant that one or more of the aromatic hydrogens are replaced by another substituent group, such as, but not limited to, hydroxy, ($C_1$–$C_6$)alkyl, cyano, halo, mercapto, and the like. The term "($C_1$–$C_6$)alkoxybenzenes" includes di- and tri-alkoxy substituted benzenes, such as dimethoxybenzene, diethoxybenzene, methoxyethoxybenzene, and the like. Thus, suitable ($C_1$–$C_6$)alkoxybenzenes include, but are not limited to, anisole, 4-methyl anisole, 4-ethyl anisole, dimethoxybenzene, dimethylanisole, diethylanisole, diethoxybenzene, methoxyethoxybenzene, and the like. Anisole is preferred. The ($C_1$–$C_6$)alkoxybenzenes are typically used in the present compositions in an amount of from about 20 to about 80% wt based on the total weight of the composition, preferably from about 25 to about 60% wt. Such ($C_1$–$C_6$)alkoxybenzenes are generally commercially available and may be used without further purification.

A wide variety of sulfonic acid compounds may be use in the present invention. The sulfonic acids may be alkyl, aryl or alkaryl. It is preferred that the sulfonic acids are surfactants. It is further preferred that the sulfonic acids are aromatic sulfonic acids. Suitable sulfonic acids include, but are not limited to, benzene sulfonic acid, ($C_1$–$C_{20}$) alkylbenzene sulfonic acid, naphthalene sulfonic acid, ($C_1$–$C_{20}$)alkylnaphthalene sulfonic acid, ($C_7$–$C_{10}$)alkaryl sulfonic acid, and the like. Preferred sulfonic acids include benzene sulfonic acid, tolyl sulfonic acid, hexylbenzene sulfonic acid, heptylbenzene sulfonic acid, octylbenzene sulfonic acid, decylbenzene sulfonic acid, dodecylbenzene sulfonic acid, tridecylbenzene sulfonic acid, quadecylbenzene sulfonic acid, hexadecylbenzene sulfonic acid, and benzyl sulfonic acid. It is further preferred that the sulfonic acid compound is one or more ($C_{12}$–$C_{20}$)alkylbenzene sulfonic acids. Mixtures of sulfonic acid compounds may be advantageously used in the present invention. The sulfonic acid compounds are generally commercially available from a variety of sources, such as Aldrich (Milwaukee, Wis.) and may be used without further purification. Typically, the sulfonic acid compounds are used in the present compositions in an amount of from about 10 to about 70% wt, based on the total weight of the composition. It is preferred that the sulfonic acid compounds are used in an amount of from about 15 to about 65% wt, and more preferably from about 20 to about 50% wt.

The compositions of the present invention may further include one or more ($C_6$–$C_{20}$)aliphatic hydrocarbons, and preferably one or more ($C_8$–$C_{16}$) aliphatic hydrocarbons. Mixtures of aliphatic hydrocarbons may be advantageously used in the present compositions. Particularly suitable aliphatic hydrocarbons include mineral spirits, and more particularly odorless mineral spirits. It is preferred that one or more ($C_6$–$C_{20}$)aliphatic hydrocarbons are used in the compositions of the present invention. Such ($C_6$–$C_{20}$)aliphatic hydrocarbons are generally commercially available from a number of sources and may be used without further purification. Typically, the one or more ($C_6$–$C_{20}$)aliphatic hydrocarbons are used in an amount of from about 10 to about 45% wt, based on the total weight of the composition, and preferably from about 20 to about 40% wt. It is further preferred that the one or more ($C_6$–$C_{20}$)aliphatic hydrocarbons and the one or more ($C_6$–$C_{16}$)olefins are present in a weight ratio of from about 1:10 to about 10:1, preferably from about 1:5 to about 5:1, and more preferably about 1:1.

The compositions of the present invention may further include one or more additional components, such as but not limited to, corrosion inhibitors, other organic solvents, wetting agents and the like. Suitable corrosion inhibitors useful in the present invention include, but are not limited to, catechol; ($C_1$–$C_6$)alkylcatechol such as methylcatechol, ethylcatechol and tert-butylcatechol; benzotriazole; ($C_1$–$C_{10}$) alkylbenzotriazoles; gallic acid; gallic acid esters such as methyl gallate and propyl gallate; and the like. It is preferred that the corrosion inhibitor is catechol, ($C_1$–$C_6$) alkylcatechol, benzotriazole or ($C_1$–$C_{10}$) alkylbenzotriazoles. When such corrosion inhibitors are used they are typically present in an amount in the range of about 0.01 to 10% wt, based on the total weight of the stripping composition.

The other organic solvents useful in the present invention are any which are at least partially miscible with the one or more olefins. Suitable other organic solvents or cosolvents include, but are not limited to, ($C_1$–$C_{20}$)alkanediols such as ethylene glycol, diethylene glycol, propylene glycol, 2-methylpropanediol and dipropylene glycol; ($C_1$–$C_{20}$) alkanediol ($C_1$–$C_6$)alkyl ethers such as propylene glycol monomethyl ether, propylene glycol dimethyl ether, propylene glycol n-butyl ether, dipropylene glycol monomethyl ether, dipropylene glycol dimethyl ether, dipropyleneglycol monobutyl ether, and propylene glycol methyl ether acetate; lactones such as γ-butyrolactone; water; and the like. It is preferred that the cosolvent is one or more of ($C_1$–$C_{20}$) alkanediols and ($C_1$–$C_{20}$)alkanediol ($C_1$–$C_6$)alkyl ethers, and more preferably one or more of propylene glycol monomethyl ether, propylene glycol dimethyl ether, propylene glycol n-butyl ether, dipropylene glycol monomethyl ether, dipropylene glycol dimethyl ether, dipropyleneglycol monobutyl ether and propylene glycol methyl ether acetate. The amount of such cosolvent to be added to the present compositions is within the ability of one skilled in the art.

Nonionic and cationic wetting agents may be used with the compositions of the present invention. Nonionic wetting agents are preferred. Such wetting agents are generally commercially available. Typically, such wetting agents are used in an amount of from about 0.2 to about 5% wt, preferably from about 0.5 to about 3% wt, and more preferably from about 1.5 to about 2.5% wt, based on the total weight of the composition.

The present compositions may be prepared by combining the one or more ($C_6$–$C_{16}$)olefins, one or more ($C_1$–$C_6$) alkoxybenzenes, and one or more organic sulfonic acid compounds, along with any optional components such as aliphatic hydrocarbons, corrosion inhibitors, cosolvents and wetting agents in any order.

The compositions of the present invention are useful in removing material selected from photoresist, probing ink or wafer bonding adhesive disposed on a substrate including the step of contacting the material with a composition including one or more ($C_6$–$C_{16}$)olefins, one or more ($C_1$–$C_6$) alkoxybenzenes, and one or more organic sulfonic acid compounds. Both positive and negative photoresists may be removed from substrates according to the present invention. The probing inks that may be removed according to the present invention include, but are not limited to, epoxy-based or polyurethane-based probing inks. The present invention is also suitable for removing wafer bonding adhesives, including, but not limited to, thermoplastic adhesives, such as poly(vinyl acetate) or "PVA." The present invention is particularly useful in removing negative photoresist material from a substrate, such as a substrate used in the manufacture of electronic devices. Suitable substrates include, but are not limited to, printed wiring board substrates, silicon wafers used in the manufacture of integrated circuits or semiconductor devices, and the like.

The photoresist, probing ink or wafer bonding adhesive (collectively "material") may be contacted with the present compositions by a variety of means, such as immersion, spraying, and the like. For example, the material may be removed from a substrate by placing the substrate in a vessel containing a stripping composition of the present invention or by dispensing a stripper composition of the present invention on the substrate, such as by spraying. When the substrate is placed in a vessel, it is preferred that the level of stripper composition in the vessel be sufficient to completely immerse the material to be removed.

The material to be stripped is typically contacted with the present compositions for a period of time sufficient to at least partially remove the material, preferably for a period of time to substantially remove the material and more preferably for a period of time to completely remove the material. The contact time of the present compositions with the material to be stripped will vary, depending upon the exact stripper composition as well as the material to be stripped. For example, the material to be removed may be contacted with the present compositions for up to about 60 minutes, preferably from about 5 seconds to about 45 minutes, and more preferably from about 15 seconds to about 35 minutes. In removing material, the compositions of the present invention may be used at room temperature or may be heated. Such heating has the advantage of shortening the time required for complete removal of the material. Typically, the compositions of the present invention are heated at a temperature of about 30° C. to about 120° C., and preferably about 40° C. to about 95° C. It is preferred that the compositions of the present invention are heated.

An advantage of the present invention is that after the substrate is removed from contact with the stripping composition of the present invention, the substrate can be then be rinsed with water, such as DI water, and subsequently processed. This avoids the conventional step of dipping the stripped substrate in iso-propanol prior to rinsing with water.

The compositions of the present invention are useful in the manufacture of electronic devices including the steps of applying a photoresist composition to a substrate to form a photoresist layer, exposing the photoresist layer through a photomask to a source of activating radiation, developing the photoresist layer to produce a pattern, etching the photoresist to transfer the pattern to the substrate, and removing the photoresist layer, wherein the photoresist layer is removed by the method of the present invention.

The compositions of the present invention are effective in removing photoresists, probing inks and wafer bonding adhesives without the need for aggressive components, such as hydroxylamine or hydroxylamine salts, tetraalkylammonium salts, amines such as alkanolamines, bases such as potassium or sodium hydroxide, and the like. It is preferred that the compositions of the present invention are free of such aggressive components. It is further preferred that the present compositions-are free of phenols,-chlorinated hydrocarbons-and chlorinated aromatic hydrocarbons. The compositions of the present invention also show reduced corrosion of sensitive metal layers as compared to known stripping compositions. Also, the present compositions provide stripping baths having greater stability, that is, having lower volatility and longer bath lives, than known compositions.

The following examples are intended to illustrate further various aspects of the present invention, but are not intended to limit the scope of the invention in any aspect.

EXAMPLE 1

Compositions were prepared according to the present invention. The components of the compositions are set forth in Table 1, as well as comparative compositions used for tests described below. DDBSA refers to dodecylbenzene sulfonic acid.

TABLE 1

| Sample | Composition (by weight) |
|---|---|
| 1 | 30% anisole, 35% DDBSA, 35% 1-dodecene |
| 2 | 37.5% anisole, 25% DDBSA, 37.5% of a 1:1 (w/w) mixture of mineral spirits and 1-dodecene |
| 3 | 20% anisole, 40% DDBSA, 20% odorless mineral spirits, 20% 1-dodecene |
| C-1* | trichlorobenzene, phenol, ($C_9$–$C_{12}$) aliphatic and aromatic hydrocarbons, and DDBSA |
| C-2* | ($C_9$–$C_{12}$) aliphatic and aromatic hydrocarbons, catechol, ethylene glycol phenyl ether and DDBSA |
| C-3* | 37.5% anisole, 37.5% DDBSA, 25% odorless mineral spirits |

*Comparative

Comparative sample C-1 is a commercially available stripping product sold under the tradename EKC-922, and is available from EKC Technologies. Comparative sample C-2 is a commercially available stripping product sold under the tradename EKC-10W20 and is available from EKC Technologies. Comparative sample C-3 is commercially available from Shipley/SVC (Santa Ana, Calif.)

EXAMPLE 2

The composition of Example 1 were tested for cleaning the following wafer probing inks manufactured by Markem Corporation: 7254 black, 8639 black, 4461 black, and series R with hysol (R-O-N) black). Table 2 sets out the results of tests for these inks on Al/Cu/Si and Cu/Ag/Si substrates with compositions of Example 1.

TABLE 2

| Ink | Sample | Conditions | Remarks |
|---|---|---|---|
| 7254 | 1 | 3 min./90° C. | 100% clean, no corrosion |
|  | 2 | 3 min./90° C. | 100% clean, |

TABLE 2-continued

| Ink | Sample | Conditions | Remarks |
|---|---|---|---|
| 8639 | 1 | 3 min./95° C. | no corrosion 100% clean, no corrosion |
|  | 2 | 3 min./95° C. | 100% clean, no corrosion |
|  | C-1* | 40–50 min./95° C. | some ink residue, severe corrosion |
|  | C-2* | 25–30 min./95° C. | 99% clean, slight residue and corrosion |
| 4461 | 1 | 3–4 min./95° C. | 100% clean, no corrosion |
|  | 2 | 3–4 min./95° C. | 100% clean, no corrosion |
| R—O—N black | 1 | 3–4 min./95° C. |  |
|  | 2 | 3–4 min./95° C. |  |
|  | C-1* | 40–50 min./95° C. | some ink residue, severe corrosion |
|  | C-2* | 25–30 min./95° C. | 99% clean, slight residue and corrosion |

The above data clearly show that the compositions of the present invention are faster at removing probing ink than known compositions and do not cause corrosion of the substrate.

EXAMPLE 3

The corrosion resulting from compositions of the present invention on various metal substrates was studied. In each test, a single wafer with Al/Cu/Si substrate on bonding pad areas of approximate dimensions of 20 microns by 20 microns was immersed in a solution of Sample 1 or 2 at 85° C. The wafers were then rinsed with isopropyl alcohol, washed with deionized water, and dried under nitrogen. The wafers were then examined for metal corrosion using a JOEL 6320 FESEM scanning electron microscope. With Sample 1, after 1 hour, slight corrosion was seen with clean bonding pads and very minor corrosion spots on the bonding pads. With Sample 2 there was no visible corrosion after 2 hours.

Similar corrosion experiments were conducted with 50% anisole, 25% DDBSA and 25% mineral spirits. Minor corrosion on Al/Si/Cu bonding pad areas was seen after 24 hours of immersion.

Similar corrosion tests were conducted using substrates of tin, a corrosion sensitive metal commonly used in the industry. The wafers used in these experiments had bonding pad metal stacks of Sn/Ag/Ti on silicon. These tests clearly indicated that the Samples 1 and 2 were not corrosive to tin metal layer, while Samples C-1 and C-2 stained and corroded tin bonding pad area, removing tin completely after 60 minutes at 95° C.

EXAMPLE 4

The samples of Example 1 were evaluated for removing photoresist. The wafers evaluated contained either hard baked negative photoresist, available under the tradenames of SC-100, SC-180, and SC-450 photoresist, available from Japan Synthetic Rubber, or a positive photoresist, sold under the tradename AZP-4110, available from Clariant. Wafers containing negative photoresist were prepared by coating wafers with negative resist, soft baked at 145° C. for 30 minutes and hard baked at 150° C. for 90 minutes. The wafers were developed with xylene, solvent VMP (naphtha), or n-butyl acetate, and then the residual photoresist was removed by treating the wafers with a composition from Example 1. The results are reported in Table 3.

TABLE 3

| Photoresist | Sample | Time/Temp. | Remarks |
|---|---|---|---|
| SC-100 | 1 | 3–4 min./85° C. | 100% clean |
| " | 2 | 4–5 min./85° C. | 100% clean |
| SC-180 | 1 | 12–15 min./90° C. | 99% clean (haze), the haze cleaned with hot DI water rinse |
| " | 2 | 12–15 min./90° C. | 100% clean |
| SC-450 | 1 | 26–30 min./95° C. | 99% clean (haze), haze cleaned with hot DI water rinse |
| " | 2 | 30–35 min./90° C. | 99% clean (haze), haze cleaned with hot DI water rinse |
| AZP-4110 | 2 | 5–7 min./85° C. | 100% clean |

The above data clearly demonstrate that the present compositions are effective at removing cross-linked positive and negative photoresist, particularly negative photoresist, from a substrate.

EXAMPLE 5

Two stripping baths were prepared, one containing Sample 3 and the other containing comparative Sample C-3. Both baths were heated to an operating temperature of 90° C. and maintained at this temperature for a period of time. After 8 hours, both baths were examined to determined bath loss. The result are reported in Table 4.

TABLE 4

| Sample | Bath Loss (volume) |
|---|---|
| 3 | ~19% |
| C-3* | ~60% |

*Comparative

The above data clearly demonstrate that rate baths prepared from the present compositions are more stable, that is are less volatile, than baths prepared from known compositions.

What is claimed is:

1. A composition comprising one or more ($C_6$–$C_{16}$) olefins, one or more ($C_1$–$C_6$)alkoxybenzenes, and one or more organic sulfonic acid compounds selected from the group consisting of benzene sulfonic acid, ($C_1$–$C_{20}$) alkylbenzene sulfonic acid, naphthalene sulfonic acid, ($C_1$–$C_{20}$)alkylnaphthalene sulfonic acid and ($C_7$–$C_{10}$) alkaryl sulfonic acid.

2. The composition of claim 1 wherein the one or more ($C_6$–$C_{16}$)olefins are alpha-olefins.

3. The composition of claim 2 wherein the one or more ($C_6$–$C_{16}$)olefins are selected from 1-decene or 1-dodecene.

4. The composition of claim 1 wherein the one or more ($C_1$–$C_6$)alkoxybenzenes are selected from the group consisting of anisole, 4-methyl anisole, 4-ethyl anisole, dimethoxybenzene, dimethylanisole, diethylanisole, diethoxybenzene and methoxyethoxybenzene.

5. The composition of claim 1 further comprising one or more additional components selected from the group consisting of corrosion inhibitors, other organic solvents and wetting agents.

6. The composition of claim 1 wherein the one or more organic sulfonic acid compounds are selected from the group consisting of tolyl sulfonic acid, hexylbenzene sulfonic acid, heptylbenzene sulfonic acid, octylbenzene sulfonic acid, decylbenzene sulfonic acid, dodecylbenzene sulfonic acid, tridecylbenzene sulfonic acid, quadecylbenzene sulfonic acid, hexadecylbenzene sulfonic acid and benzyl sulfonic acid.

7. The composition of claim 1 wherein the one or more ($C_6$–$C_{16}$)olefins are present in an amount of from about 10 to about 55% wt, based on the total weight of the composition.

8. The composition of claim 1 wherein the one or more ($C_1$–$C_6$)alkoxybenzenes are present in an amount of from about 20 to about 80% wt based on the total weight of the composition.

9. The composition of claim 1 wherein the one or more organic sulfonic acid compounds are present in an amount of from about 10 to about 70% wt, based on the total weight of the composition.

10. The composition of claim 1 further comprising one or more ($C_6$–$C_{20}$)aliphatic hydrocarbons.

11. The composition of claim 10 wherein the one or more ($C_6$–$C_{20}$)aliphatic hydrocarbons are present in an amount of from about 10 to about 45% wt, based on the total weight of the composition.

12. A composition comprising one or more ($C_6$–$C_{16}$) olefins selected from 1-decene or 1-dodecene, one or more ($C_1$–$C_6$)alkoxybenzenes, and one or more organic sulfonic acid compounds.

13. A composition comprising one or more ($C_6$–$C_{16}$) olefins, one or more ($C_1$–$C_6$)alkoxybenzenes, and one or more organic sulfonic acid compounds and one or more ($C_6$–$C_{20}$)aliphatic hydrocarbons.

14. The composition of claim 13 wherein the one or more ($C_6$–$C_{16}$)olefins are alpha-olefins.

15. The composition of claim 13 wherein the one or more ($C_1$–$C_6$)alkoxybenzenes are selected from the group consisting of anisole, 4-methylanisole, 4-ethyl anisole, dimethoxybenzene, dimethylanisole, diethylanisole, diethoxybenzene and methoxyethoxybenzene.

16. The composition of claim 13 wherein the one or more organic sulfonic acid compounds are selected from the group consisting of benzenesulfonic acid, ($C_1$–$C_{20}$) alkylbenzene sulfonic acid, naphthalene sulfonic acid, ($C_1$–$C_{20}$)alkylnaphthalene sulfonic acid and ($C_7$–$C_{10}$) alkaryl sulfonic acid.

17. The composition of claim 13 wherein the one or more ($C_6$–$C_{16}$)olefins are present in an amount of from about 10 to about 55% wt, based on the weight of the composition.

18. The composition of claim 13 wherein the one or more ($C_1$–$C_6$)alkoxybenzenes are present in an amount of from about 20 to about 80% wt, based on the total weight of the composition.

19. The composition of claim 13 wherein the one or more ($C_6$–$C_{20}$)aliphatic hydrocarbons are present in an amount of from about 10 to about 45% wt, based on the total weight of the composition.

* * * * *